(12) United States Patent
Loy

(10) Patent No.: US 6,838,867 B2
(45) Date of Patent: Jan. 4, 2005

(54) ELECTRICAL-ENERGY METER

(75) Inventor: Garry M. Loy, Raleigh, NC (US)

(73) Assignee: Elster Electricity, LLC, Raleigh, NC (US)

( * ) Notice: Subject to any disclaimer, the term of this patent is extended or adjusted under 35 U.S.C. 154(b) by 0 days.

(21) Appl. No.: 10/185,678

(22) Filed: Jun. 27, 2002

(65) Prior Publication Data

US 2004/0000900 A1 Jan. 1, 2004

(51) Int. Cl.⁷ .............................................. G01R 11/32
(52) U.S. Cl. ...................................... 324/142; 361/659
(58) Field of Search ................................ 324/142, 141, 324/144, 134, 114, 74, 723, 714; 361/659, 664, 666, 667, 668

(56) References Cited

U.S. PATENT DOCUMENTS

| | | | |
|---|---|---|---|
| 1,919,213 A | 7/1933 | Emens | |
| 1,969,499 A | 8/1934 | Bradshaw et al. ............. | 171/34 |
| 2,313,881 A | 3/1943 | Lewis .......................... | 220/24 |
| 2,402,360 A | 6/1946 | Bevins ......................... | 220/82 |
| 2,895,637 A | 7/1959 | Bakke ......................... | 220/40 |
| 3,001,668 A | 9/1961 | Burk et al. .................... | 220/82 |
| 3,334,276 A | 8/1967 | Bateman et al. ............. | 317/108 |
| 3,707,653 A | 12/1972 | Coffey et al. ................ | 317/120 |
| 4,368,943 A | 1/1983 | Davis et al. .................. | 339/198 |
| 4,556,844 A | 12/1985 | Wason ......................... | 324/156 |
| 4,783,623 A | 11/1988 | Edwards et al. ............. | 324/156 |
| 4,959,607 A | 9/1990 | Coryea et al. ........... | 324/103 R |
| 5,001,420 A | 3/1991 | Germer et al. .............. | 324/142 |
| 5,066,906 A | 11/1991 | Moore ......................... | 324/142 |
| 5,089,771 A | 2/1992 | Tanguay et al. ............ | 324/142 |
| 5,173,657 A | 12/1992 | Holdsclaw ................... | 324/142 |
| 5,270,639 A | 12/1993 | Moore ......................... | 324/142 |
| 5,473,504 A | 12/1995 | Horan et al. ................ | 361/667 |
| 5,495,167 A | 2/1996 | Cotroneo ...................... | 324/74 |
| 5,577,933 A | * 11/1996 | Robinson et al. ........... | 439/517 |
| 5,742,512 A | 4/1998 | Edge et al. ................. | 364/480 |
| 5,966,010 A | * 10/1999 | Loy et al. ................... | 324/142 |

* cited by examiner

Primary Examiner—Kamand Cuneo
Assistant Examiner—Trung Q. Nguyen
(74) Attorney, Agent, or Firm—Woodcock Washburn LLP

(57) ABSTRACT

A presently-preferred embodiment of an electrical-energy meter comprises a base adapted to be mounted on a supporting surface, a current sensor assembly comprising a plurality of contact blades extending through the base and adapted to electrically contact a conductor of electrical energy, and a current transformer mechanically coupled to the base and electrically coupled to the contact blades. The electrical-energy meter further comprises a circuit board assembly comprising a main circuit board electrically coupled to the current transformer and the contact blades. The electrical-energy meter also comprises a circuit-board support member comprising a rim portion fixedly coupled to the base, and a first bracket adjoining the rim portion. The first bracket has a first and a second leg each extending away from the rim portion and the base and each being adapted to securely engage the main circuit board.

35 Claims, 13 Drawing Sheets

ELECTRICAL-ENERGY METER

FIELD OF THE INVENTION

The present invention relates to distribution systems for electrical power. More particularly, the invention relates to a solid-state meter for measuring the consumption of electrical energy in, for example, a residential dwelling.

BACKGROUND OF THE INVENTION

Solid-state electrical energy meters, also referred to as "watt-hour meters," are used on a widespread basis in commercial and industrial applications. Solid-state meters offer advantages in relation to conventional electromechanical electrical-energy meters. For example, solid-state electrical-energy meters can incorporate features that offer programmability, as well as flexibility in tailoring the various functions of the meter to a particular user, without substantially increasing the overall cost of the meter.

The use of solid-state electrical-energy meters in residential applications has not progressed to the extent of commercial and industrial use. In particular, typical residential applications do not require the comparatively high degree of functionality called for in many commercial and industrial applications. Hence, the cost advantages offered by solid-state meters in relation to programmability and functionality, in general, are not as significant in residential applications as they are in commercial and industrial applications.

The demand for greater programmability and functionality in residential electrical-energy meters, however, is increasing. Hence, the demand for solid-state electrical-energy meters in residential applications is expected to increase dramatically in the near future. The manufacturing costs of solid-state meters, however, need to be comparable to or lower than those of electromechanical meters in order for solid-state meters to compete successfully in the residential-use market. Moreover, any electrical-energy meter intended for residential use must comply with the applicable requirements of the American National Standards Institute (ANSI) to ensure compatibility with existing power-distribution networks.

Conventional electrical-energy meters of both the electromechanical and solid-state type typically incorporate a relatively large number of fasteners, e.g., screws, rivets, eyelets, pins, etc., to secure the various components thereof. These fasteners increase the overall parts count and the assembly time of the meter, and thus raise the manufacturing cost thereof.

Moreover, the base and other components of conventional electrical-energy meters are usually formed from thermosetting plastics. Thermosetting plastics are relatively hard and brittle, and thus are not well suited to withstand the impact loads that electrical-energy meters are typically exposed to during shipping and installation. Hence, components manufactured from these types of materials must have relatively large cross sections to provide the components with sufficient resistance to the anticipated impact loads. This requirement increases the manufacturing cost of the meter. Moreover, the brittle quality of thermosetting plastics precludes the use of cost-effective design features that require resilient components.

Consequently, a need exists for a solid-state electrical-energy meter for residential applications that has a comparatively low cost, and complies with the applicable ANSI requirements.

SUMMARY OF THE INVENTION

A presently-preferred embodiment of an electrical-energy meter comprises a base adapted to be mounted on a supporting surface, a current sensor assembly comprising a plurality of contact blades extending through the base and adapted to electrically contact a conductor of electrical energy, and a current transformer mechanically coupled to the base and electrically coupled to the contact blades. The current transformer is adapted to produce an electrical output proportional to an electrical current in the conductor of electrical energy.

The electrical-energy meter further comprises a circuit board assembly comprising a main circuit board electrically coupled to the current transformer and the contact blades. The circuit board assembly is adapted to calculate and display a cumulative amount of electrical energy passing through the conductor of electrical energy based on the electrical output of the current transformer and a voltage of the conductor of electrical energy. The electrical-energy meter also comprises a circuit-board support member comprising a rim portion fixedly coupled to the base, and a first bracket adjoining the rim portion. The first bracket has a first and a second leg each extending away from the rim portion and the base and each being adapted to securely engage the main circuit board.

Another presently-preferred embodiment of an electrical-energy meter comprises a base, and a current sensor assembly comprising a plurality of contact blades and at least one current transformer mechanically coupled to the base and electrically coupled to the contact blades. The electrical-energy meter further comprises a circuit board assembly comprising a circuit board electrically coupled to the current transformer and the contact blades, and a circuit-board support member comprising a substantially circular rim portion having a first and a second plurality of retaining clips formed thereon. The first plurality of retaining clips are each adapted to securely engage the base by way of a corresponding through hole formed in the base, whereby the circuit-board support member is secured to the base without the use of external fasteners.

The electrical-energy meter also comprises an inner housing adapted to securely engage the circuit-board support member so the that the inner housing and the base substantially enclose the current sensor assembly and the circuit board assembly. The inner housing comprises a plurality of snaps each having a through hole formed therein. Each of the second plurality of retaining clips is adapted to substantially align with and become disposed in a respective one of the through holes in the snaps as the inner housing is mated with the circuit-board support member thereby causing the second plurality of retaining clips to securely engage the inner housing whereby the inner housing is secured to the circuit-board support member without the use of external fasteners.

BRIEF DESCRIPTION OF THE DRAWINGS

The foregoing summary, as well as the following detailed description of a presently-preferred embodiment, is better understood when read in conjunction with the appended drawings. For the purpose of illustrating the invention, the drawings show an embodiment that is presently preferred. The invention is not limited, however, to the specific instrumentalities disclosed in the drawings. In the drawings.

DESCRIPTION OF PRESENTLY-PREFERRED EMBODIMENTS

Figure 1:
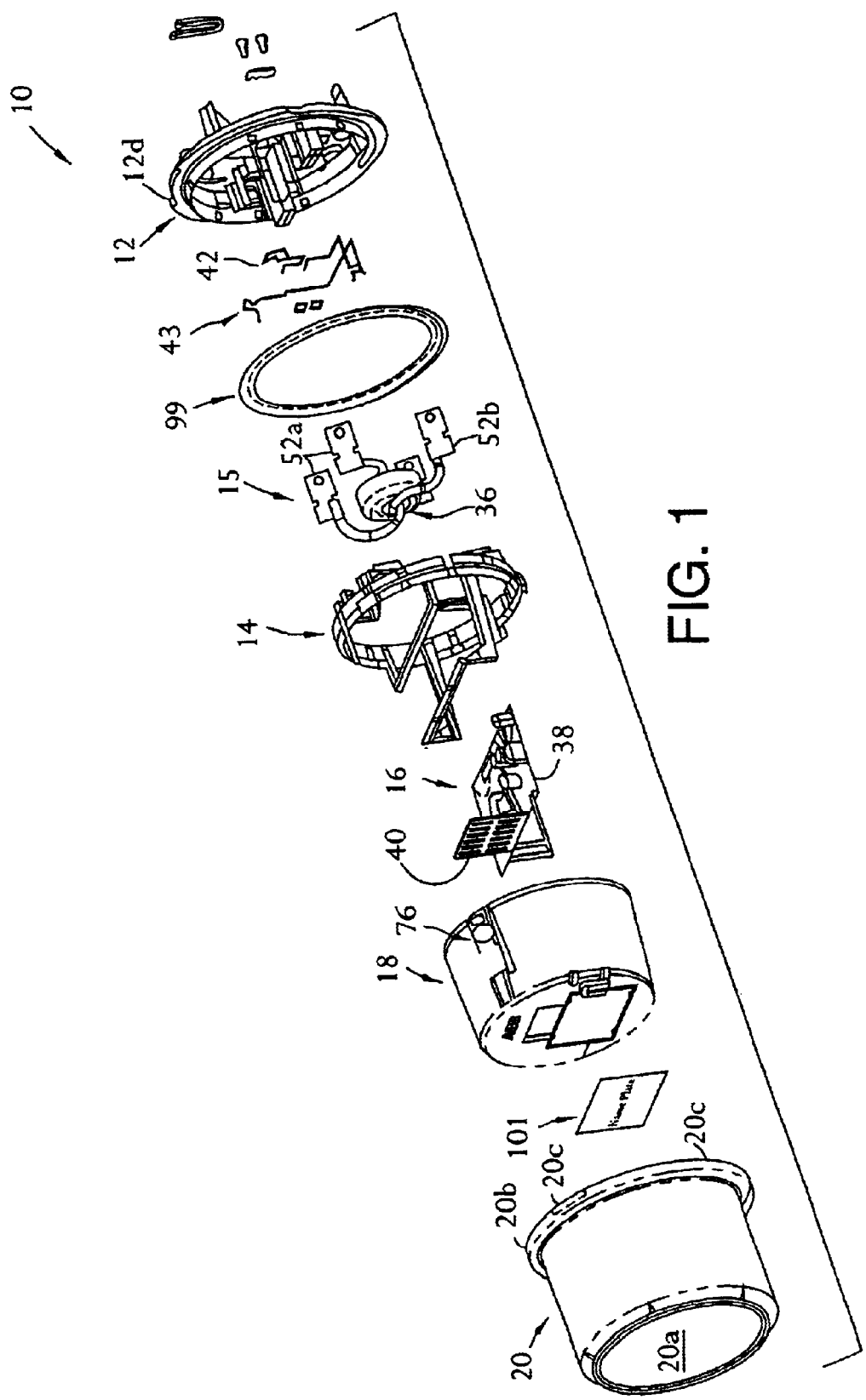
FIG. 1 is an exploded, top perspective view of a presently-preferred embodiment of an electrical-energy meter.

A presently-preferred embodiment of a solid-state electrical-energy meter 10 adapted for residential use is depicted in FIGS. 1 to 15B. The electrical-energy meter 10 is described in detail for exemplary purposes only, as the various features of the present invention can be incorporated into other types of electrical-energy meters, including electrical-energy meters adapted for commercial and industrial uses.

The electrical-energy meter 10 comprises a base 12, a circuit-board support member 14, a current sensor assembly 15, a circuit board assembly 16, an inner housing 18, and a cover 20.

The base 12 is depicted in detail in FIGS. 3, 5, 14A, and 16. The base 12 is preferably molded from a reinforced thermoplastic material having the requisite mechanical, electrical, and thermal properties, flammability rating, UV stabilization, and resistance to common solvents such as insecticides and cleaning solutions. An example of such thermoplastic material is polyketone or PBT.

Figure 3:
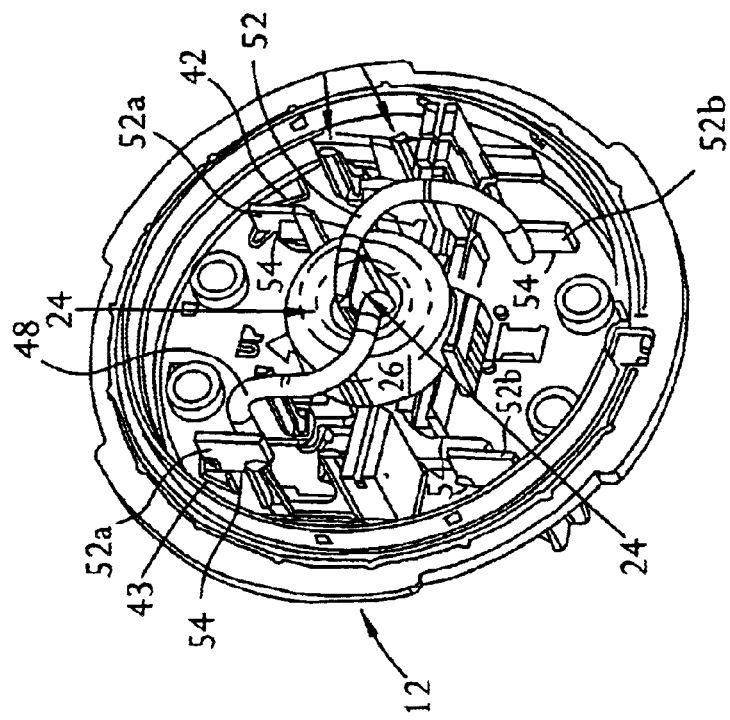
FIG. 3 is a bottom perspective view of a base and a current sensor assembly of the electrical-energy meter shown in FIGS. 1 and 2.
Figure 2:
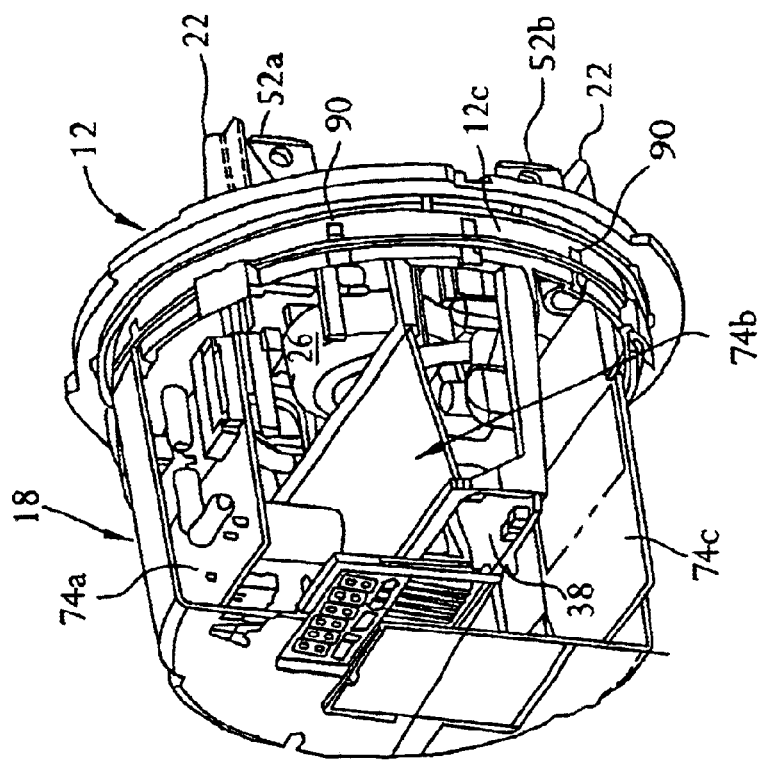
FIG. 2 is a top perspective, partial cutaway view of the electrical-energy meter shown in FIG. 1.

The current sensor and conductor assembly 15 is mounted on the base 12 (see FIG. 3). More particularly, the base 12 has a tongue-shaped support 24 formed thereon. The support 24 is tapered so that the width and thickness thereof increase progressively from the top (freestanding) to the bottom ends thereof. The current sensor 15 comprises an annular current transformer 26 having resilient crush ribs 28 positioned along an inner circumference thereof (see FIG. 4).

The current transformer 26 is securely positioned around the support 24. More specifically, the crush ribs 28 interferedly contact the support 24 as the current transformer 26 is pushed onto the support 24. Contact between the crush ribs 28 and the support 24 causes the crush ribs 28 to deform and securely engage the support 28, thereby securing the current transformer 26 (and the current sensor and conductor assembly 15) to the base 12.

Figure 5:
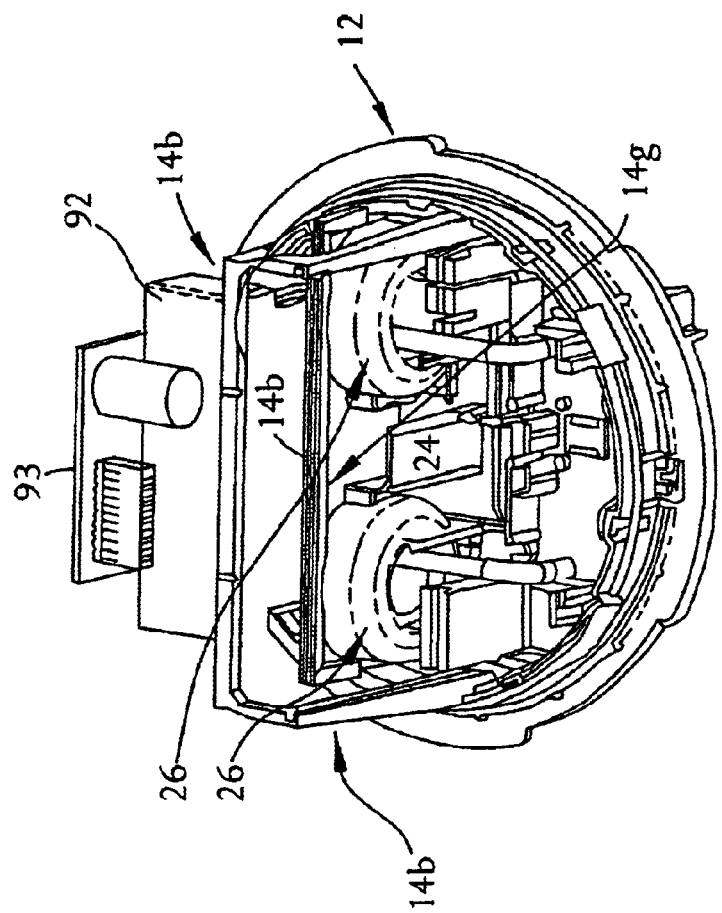
FIG. 5 is a bottom perspective view of the base shown in FIG. 4, a power-disconnect switch, and an alternative, two-transformer current sensor assembly of the electrical-energy meter shown in FIGS. 1 and 2.
Figure 4:
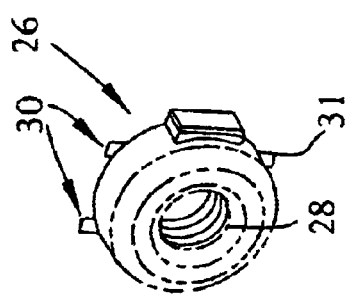
FIG. 4 is a top perspective view of a current transformer of the current sensor assembly shown in FIG. 3.
Figure 15B:
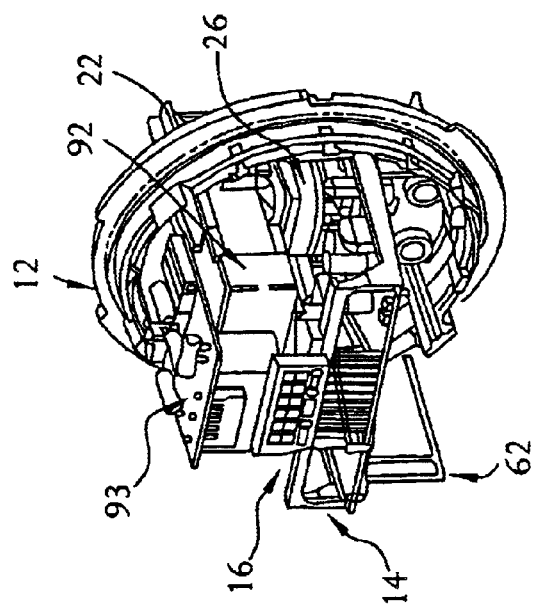
FIG. 15B is a top perspective view of the base, the circuit-board support member, the power-disconnect switch, the two-transformer current sensor assembly, the liquid-crystal display, the mounting bracket, the circuit board assembly, and the radio-communications antenna shown in FIGS. 3, 5, 6, 7, 8A, 8B, 8C, 9, 10, 11A, 11B, 12, 13A, 14A, 14B, or 15A.
Figure 15A:
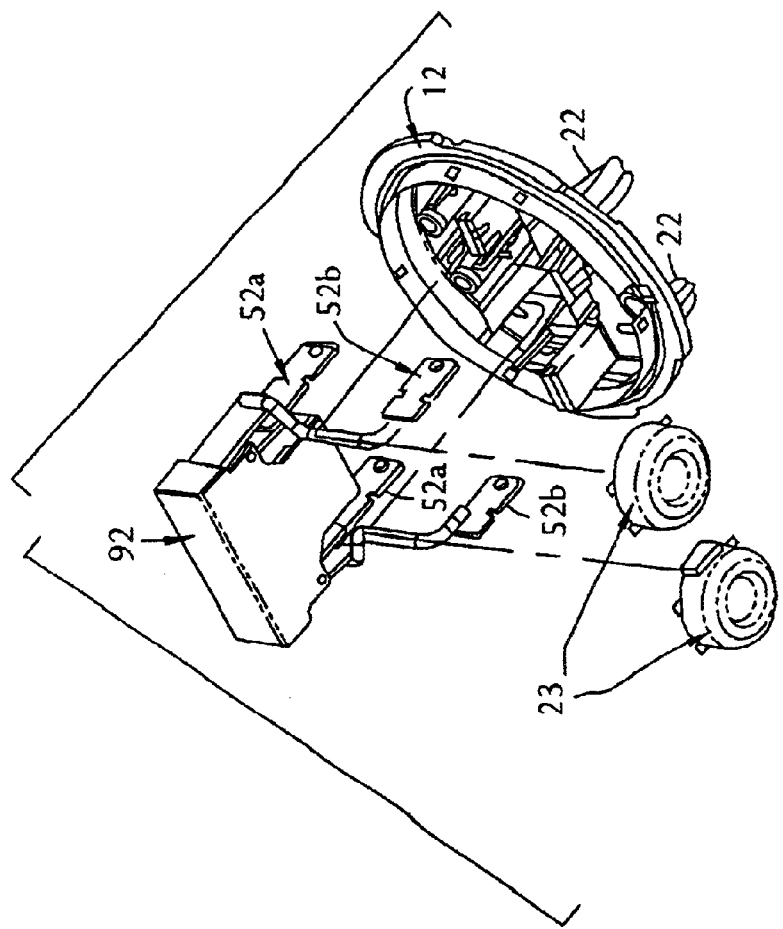
FIG. 15A is a bottom perspective, exploded view of the base shown in FIGS. 3, 5, 13, and 14A, and the power-disconnect switch and the two-transformer current sensor assembly shown in FIG. 5.

Alternative configurations of the electrical-energy meter 10 may include two of the current transformers 28, as depicted in FIGS. 5, 15A, and 15B. Notably, the base 12 can accommodate the two-transformer configuration with no modifications thereto, as follows.

Figure 16:
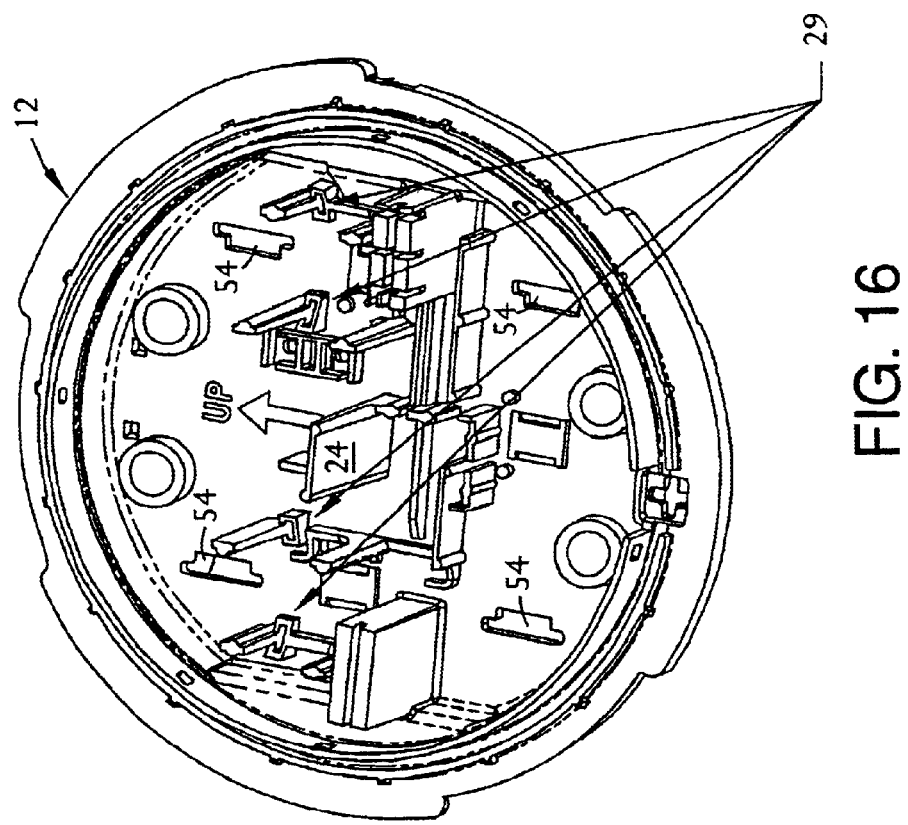
FIG. 16 is a bottom perspective view of the base shown in FIGS. 3, 5, 13, 14A, 15A, and 15B.

The base 12 has four receptacles 29 formed therein (see FIG. 16). The current transformers 28 each have a first pair of tabs 30 formed on one side thereof, and a second pair of tabs 31 formed on an opposing side thereof (see FIG. 4). The receptacles 29 are each adapted to securely engage a corresponding one of the tabs 30. The circuit-board support member 14 is adapted to securely engage the tabs 31 by way of a groove 51 formed in the circuit-board support member 14 (as described below), thereby securing the current transformers 28 in place between the circuit-board support member 14 and the base 1.

Figure 9:
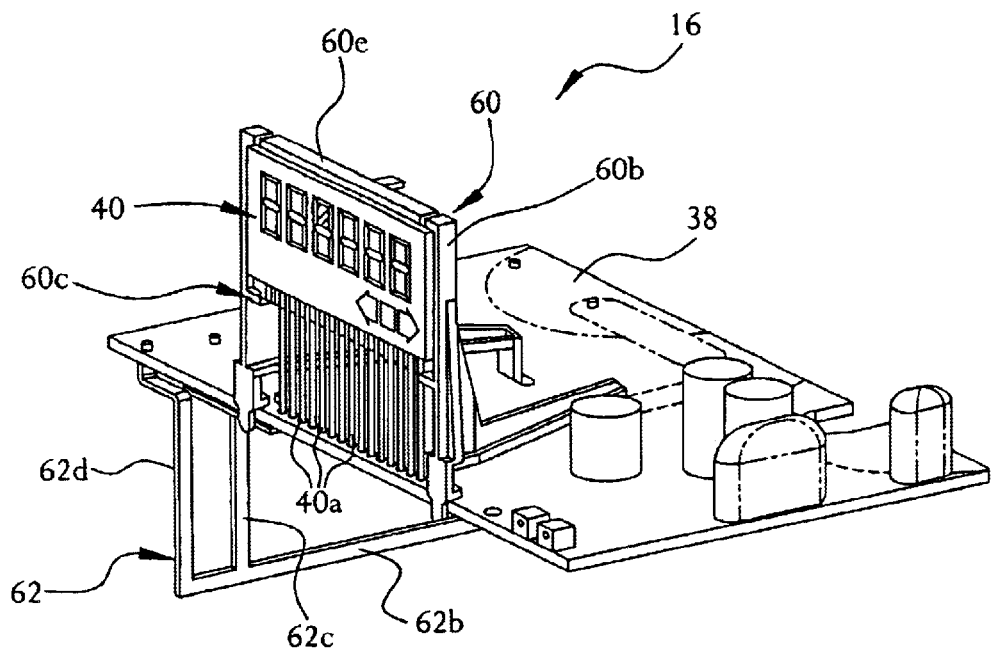
FIG. 9 is a top perspective view of the circuit board assembly and the radio-communications antenna shown in FIG. 6, and a lighted crystal display and a mounting bracket of the electrical-energy meter shown in FIGS. 1 and 2.

The circuit board assembly 16 comprises a main circuit board 38 and a substantially flat liquid crystal display (LCD) 40 (see FIG. 9). The main circuit board 38 is electrically coupled to the current transformer(s) 28. The main circuit board 38 also receives an input or line voltage, i.e., a voltage corresponding to the voltage in the electrical-energy line to which the electrical-energy meter 10 is connected, by way of a first and a second voltage spring 42, 43 (described in detail below). The circuit board assembly 16 is adapted to calculate the total (cumulative) watt-hours of power that have passed through the electrical-energy meter 10 over time based on the current and voltage input, using conventional techniques and components known to those skilled in the field of electrical-energy meter design. The circuit board assembly 16 continually updates the cumulative watt-hours, and displays the updated value on the LCD 40.

The electrical-energy meter 10 can accommodate one or more optional circuit boards 74a, 74b, 74c adapted to perform additional functions such as communications, pulse/relay output, service disconnect and installation, etc. (see FIG. 6). The ability to incorporate multiple circuit boards can enhance the functionality of the electrical-power meter 10, and thus represents a substantial advantage over conventional meter designs, which typically incorporate those functions into a single, main circuit board. Specific details relating to the optional circuit boards 74a, 74b, 74c, and further details relating to the circuit board assembly 16 are not necessary to an understanding of the invention, and therefore are not presented herein.

The circuit-board support member 14 partially supports the circuit board assembly 16 and the optional circuit boards 74a, 74b, 74c, as follows. The circuit-board support member 14 comprises a ring-shaped portion 14a, and a bracket 14b unitarily formed with and extending from the rim portion 14a (see FIGS. 7 and 8A). The bracket 14b comprises substantially L-shaped side portions 14c, 14d. The side portions 14c, 14d each have a groove 46 formed therein. The grooves 46 are adapted to securely engage opposing side edges of the 30 main circuit board 38, thereby securing the circuit board assembly 16 to the circuit-board support member 14 (and the base 12) (see FIG. 7).

The bracket 14b also includes a transverse portion 14f unitarily formed with the side portions 14c, 14d. The substantially L-shaped configuration of the side portions 14c, 14d positions the transverse portion 14f at an elevation above that of the side portions 14c, 14d (from the perspective of FIGS. 7 and 8A). The transverse portion 14f has a groove 47 formed in a rearward-facing surface thereon. The groove 47 securely engages a forward edge of the optional circuit board 74b.

A second bracket 14g is unitarily formed with and extends from the rim portion 14a. The second bracket 14g has a transverse portion 14h. The transverse portion 14h has a groove 49 formed in a forward-facing surface thereof. The groove 49 securely engages a rearward edge of the optional circuit board 74b. The optional circuit board 74b is thus supported by the brackets 14b, 14g.

The transverse portion 14h has a groove 51 formed in a rearward-facing surface thereof. The groove 51 is adapted to securely receive the tabs 31 on the current transformers 28, thereby securing the current transformers 28 to the circuit-board support member 14 when the electrical-energy meter 10 is configured with two of the current transformers 28 (see FIG. 5).

Figure 7:
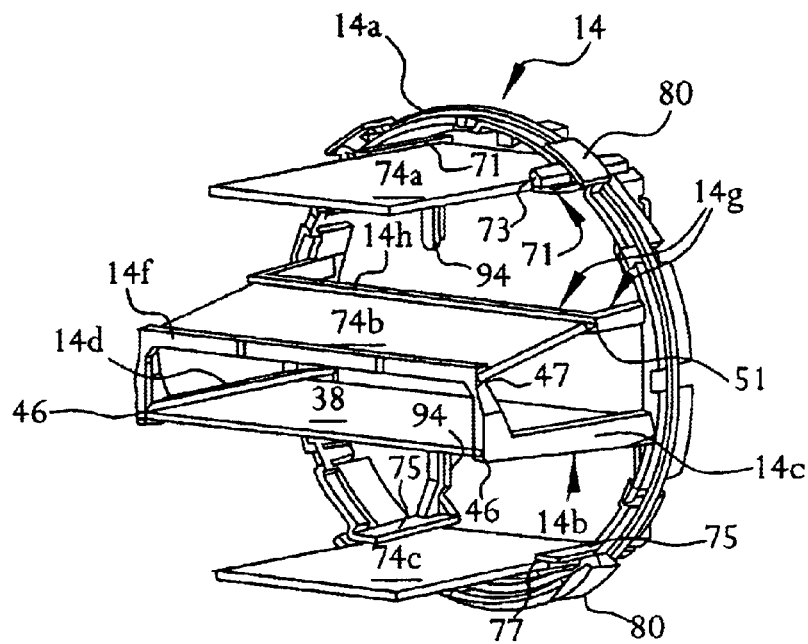
FIG. 7 is a side perspective view of a circuit-board support member and circuit boards of the electrical-energy meter shown in FIGS. 1 and 2.
Figure 8A:
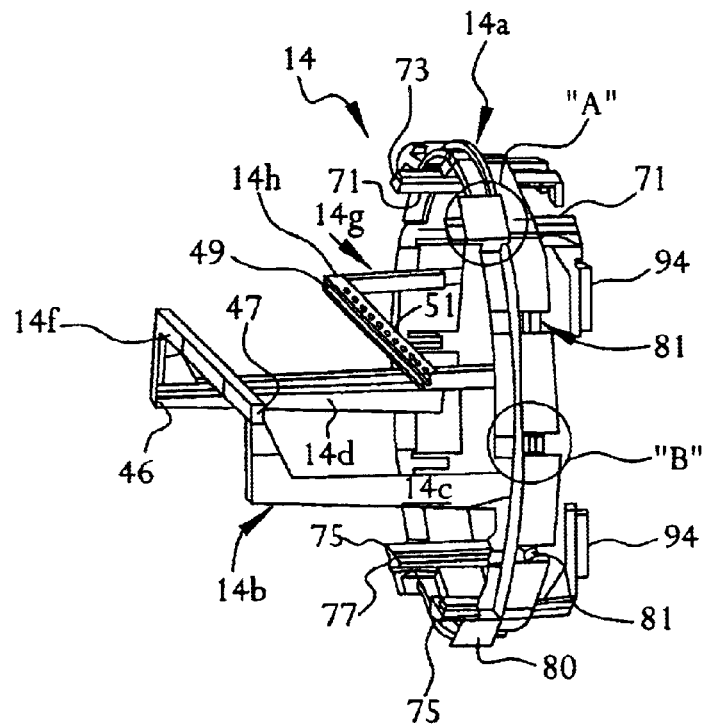
FIG. 8A is a top perspective view of the circuit-board support member shown in FIG. 7.

Notably, the bracket 14g is positioned at an elevation above that of the bracket 14b, from the perspective of FIGS. 7 and 8A (thereby giving the optional circuit board 74b an angled orientation as depicted in FIG. 7). This feature permits the circuit-board support member 14 to be molded using relatively simple and inexpensive "straight-pull" tooling (as opposed to a slicing apparatus), with no effect on the overall functionality of the circuit-board support member 14. Forming the circuit-board support member 14 using straight-pull tooling simplifies the manufacturing process, and reduces the manufacturing cost of the circuit-board support member 14.

The circuit-board support member 14 includes two board supports 71 unitarily formed with the rim portion 14a (see FIGS. 7 and 8A). The board supports 71 each have a groove 73 formed therein. The grooves 73 are adapted to securely engage opposing sides of the optional circuit board 74a, thereby causing the board supports 71 to partially support the optional circuit board 74a. The circuit-board support member 14 likewise includes two circuit-board support fingers 75 unitarily formed with the rim portion 14a. The circuit-board support fingers 75 each have a groove 77 formed therein. The grooves 77 are adapted to securely engage opposing sides of the optional circuit board 74c, thereby causing the circuit-board support fingers 75 to partially support the optional circuit board 74c.

The circuit-board support member 14 is secured to the base 12 as follows. The circuit-board support member 14 has a total of eight retaining clips 81 formed thereon. Each retaining clip 81 has a barbed portion 81a (see FIG. 8C). The base 12 includes a rim portion 12c having a total of eight through holes 90 formed therein (see FIGS. 2 and 8C).

The circuit-board support member 14 and the base 12 are mated by substantially aligning each retaining clip 81 with a corresponding snap 76, and urging the circuit-board support member 14 toward the base 12 by applying moderate force to the circuit-board support member 14.

The barb-shaped portions 81a of each retaining clip 81 are adapted to contact the rim portion 12c and resiliently deform as the circuit-board support member 14 is moved toward the base 12. Continued movement of the circuit-board support member 14 toward the base 12 causes each barb-shaped portion 81a to substantially align with a corresponding one of the through holes 90. The resilience of the barb-shaped portion 81a causes the barb-shaped portion 81a to snap into the through hole 82 and thereby engage the rim portion 12c.

The engagement of the barb-shaped portions 81a and the rim portion 12c retains the circuit-board support member 14 on the base 12. Hence, the circuit-board support member 14 can be quickly and easily secured to the base 12 without the use of external fasteners. The circuit-board support member 14 can be released from the base 12 by depressing the barb-shaped portions 81a to move each barb-shaped portion 81a out of the corresponding through hole 90. Moreover, the retaining clips 81 provide a secure connection that minimizes the potential for accidental separation of the circuit-board support member 14 from the base 12.

Further details relating to the circuit-board support member 14 are presented below.

Details relating to the current sensor assembly 15 are as follows. The current sensor assembly 15 comprises the current transformer 26 and the voltage springs 42, 43, as noted previously. The current sensor assembly 15 also comprises a pair of input leads 48, a corresponding pair of output leads 50, a first pair of contact blades 52a, and a substantially identical second pair of contact blades 52b. The contact blades 52a are each electrically and mechanically coupled to a respective one of the input leads 48, and the contact blades 52b are each electrically and mechanically coupled to a respective one of the output leads 50.

The contact blades 52a, 52b comply with ANSI specifications for residential electrical-energy meters. Each contact blade 52a, 52b extends through the base 12 by way of a corresponding slot 54 formed in the base 12 (see FIGS. 3, 14A, and 16). The blades 52a, 52b may be retained in the slots 54 by conventional means such as cotter pins or, preferably, by the structure described in U.S. Pat. No. 5,966,010, which is incorporated by reference herein its entirety. (The contact blades 52a, 52b are also secured by the circuit-board support member 14, as explained in detail below.)

Figure 14A:
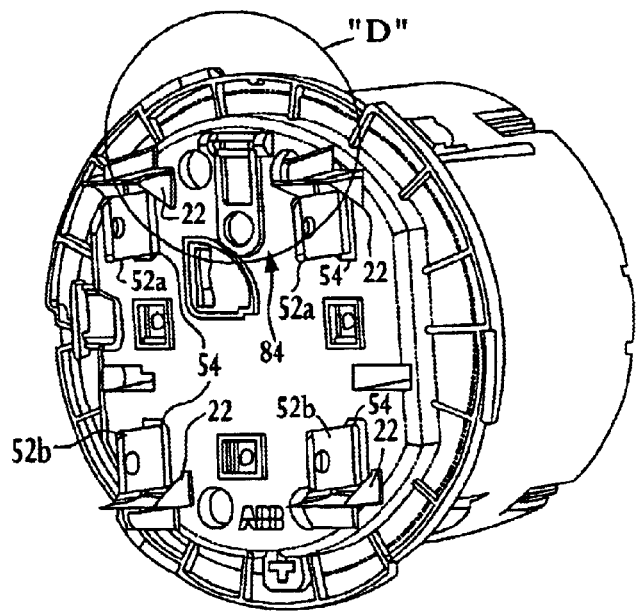
FIG. 14A is a side perspective view of the base and the inner housing in FIGS. 3, 5, 13A, or 13B, and a hanger of the electrical-energy meter shown in FIGS. 1 and 2, with the hanger is a stored position.

Each contact blade 52a, 52b projects from the rear surface 12a of the base 12 proximate a corresponding voltage shield 22 that extends from the rear surface 12 (see FIG. 14A). The contact blades 52a, 52b are each adapted to slidably and securely engage a corresponding ANSI-standard socket mounted on the residential dwelling and electrically coupled to the line that supplies electrical power to the dwelling. More particularly, the ANSI-standard sockets each comprise spring-loaded jaws that securely grasp the corresponding contact blade 52a, 52b.

The input leads 48 electrically couple the power line of the residential dwelling to the input side of the current transformer 26. The current transformer 26 generates a low-voltage output that is proportional to the current entering the current transformer 26 by way of the input leads 48. The output leads 50 electrically couple the output side of the current transformer 26 to the power line of the residential dwelling. The low-voltage output of the current transformer 26 is processed by the circuit board assembly 16 to generate a display that represents the cumulative watt-hours of power consumed by the residential dwelling over time. (Further details relating to the current transformer 26 are not necessary to an understanding of the invention, and therefore are not presented herein.)

The input and output leads 48, 50 are not insulated. Compliance with the applicable ANSI standards for surge-voltage capability is achieved by spacing the input and output leads 48, 50 as shown in the figures, and through the use of the support 24. More specifically, the support 24 is positioned between the input leads 48 where the input leads 48 come into proximity, i.e., where the input leads 48 are coupled to the current transformer 26 (see FIG. 3). The support 24 is likewise positioned between the output leads 50 where the output leads 50 come into close proximity, i.e., where the output leads 48 are coupled to the current transformer 26.

The insulative properties of the thermoplastic material from which the support 24 is formed cause the support 24 to act as a voltage barrier between the input leads 48, and between the output leads 50. The support 24 thereby prevents or inhibits surge voltages from passing between the input leads 48, and between the output leads 50. (It should be noted that the support 24 performs the noted voltage-blocking function in configurations that use a single current transformer 26 only.)

The contact blades 52a, 52b are also secured by the circuit-board support member 14, as noted above. In particular, the circuit-board support member 14 includes four keys 94 unitarily formed with the rim portion 14a (see FIGS. 7 and 8A). Each of the keys 94 substantially aligns with and is partially disposed in a respective slot 54 in the base 12 when the circuit-board support member 14 and the base 12 are coupled as noted above. The resulting contact between the key 94 and the corresponding contact blade 52a, 52 inhibits the contact blade 52a, 52 from backing out of the corresponding slot 54.

The keys 94 and the slots 54 thus permit the contact blades 52a, 52b to be installed in, secured to, and removed from the base 12 quickly and easily, without the use of external fasteners, locking pins, or tooling.

Details relating to the first and second voltage springs 42, 43 are as follows. The first and second voltage springs 42, 43 are formed from an electrically-conductive material, and are not insulated. The voltage springs 42, 43 electrically couple the contact blades 52a to the main circuit board 38 (see FIG. 6). The voltage springs 42, 43 thus provide the main circuit board 38 with signals corresponding to the line voltage being input to the electrical-energy meter 10.

Figure 6:
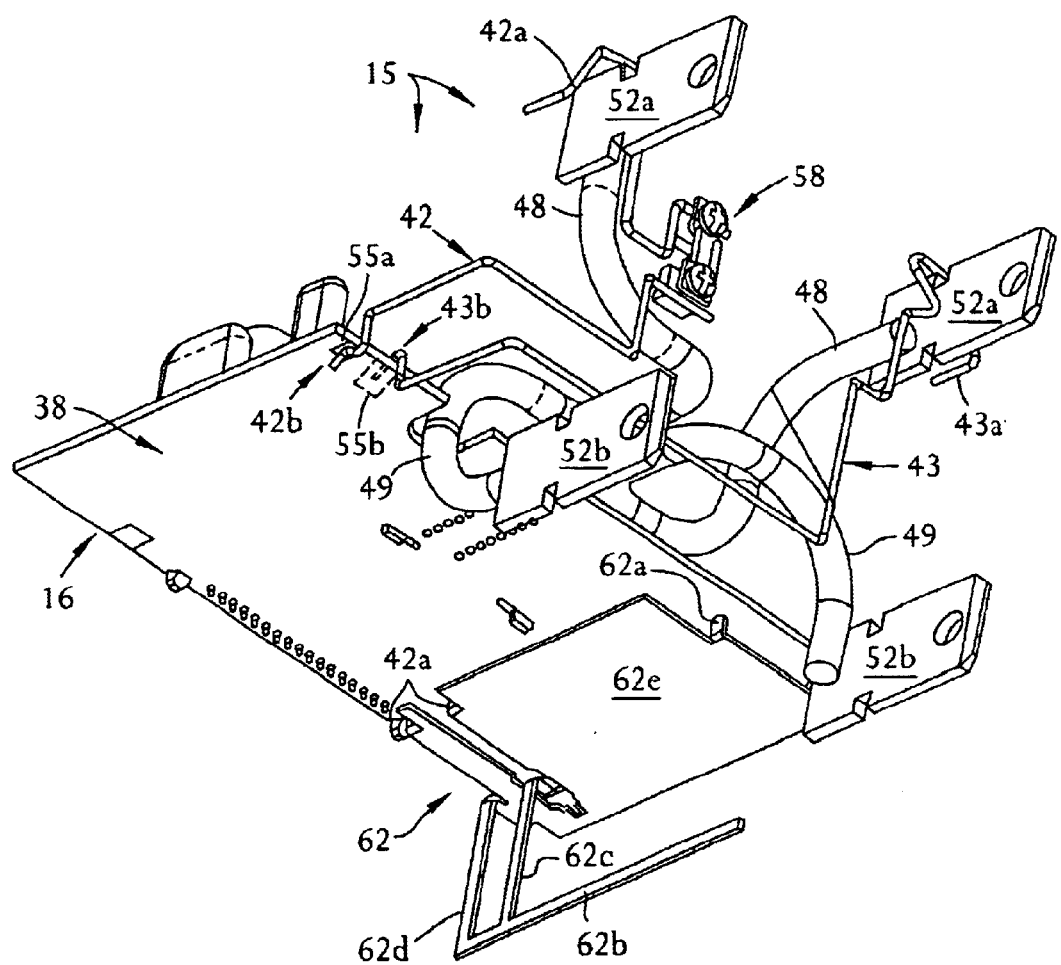
FIG. 6 is a bottom perspective view of a circuit board assembly and a radio-communications antenna of the electrical-energy meter shown in FIGS. 1 and 2.

A first end 42a the voltage spring 42 is adapted to grasp opposing sides of one of the contact blades 52a, as depicted in FIG. 6. A first end 43a the voltage spring 43 is likewise adapted to grasp opposing sides of the other of the contact blades 52a. (The voltage springs 42, 43 are not soldered or otherwise hard-wired to the contact blades 52a). This arrangement permits the contact blades 52a to flex to a limited degree while remaining in contact with the voltage springs 42, 43, and without placing substantial stress on the voltage springs 42, 43 (flexing of the contact blades 52a, 52b normally occurs when the contact blades 52a, 52b are inserted into the corresponding mounting sockets on the residential dwelling). Moreover, the ends 42a, 42b each include a portion that is spaced apart from the corresponding contact blade 52a, 52b, thereby facilitating a voltage connection between the contact blade 52a, 52b and an auxiliary circuit board.

The first voltage spring 42 comprises a voltage disconnect 58, as required by applicable ANSI specifications (see FIG. 6).

A second end 42b of the voltage spring 42, and a second end 43b of the voltage spring 43 are electrically and mechanically coupled to the main circuit board 38 as follows. The main circuit board 38 comprises a first and a second contact pad 55a, 55b. The first and second contact pads 54a, 54b are positioned respectively on top and bottom surfaces of the main circuit board 38, proximate an edge of the main circuit board 38.

The second end 42b of the voltage spring 42 is secured to first contact pad 55a by conventional means such as soldering. The second end 43b of the voltage spring 43 is likewise secured to the second contact pad 55b by conventional means such as soldering. This arrangement forms a "card-edge" connection between the voltage springs 42, 43 and the main circuit board 38.

Notably, the voltage springs 42, 43 are coupled to opposing sides of the main circuit board 38. This feature enhances the surge-voltage capability of the main circuit board 38. More particularly, a given level of surge-voltage capability can be achieved with a smaller overall spacing between the contact pads 55a, 55b if the contact pads 55a, 55b are positioned on opposite surfaces of the main circuit board 38. Closer spacing between the contact pads 55a, 55b conserves space on the main circuit board 38. This feature is particularly advantageous given the limited amount of space available within the electrical-energy meter 10 for the main circuit board 38.

Figure 10:
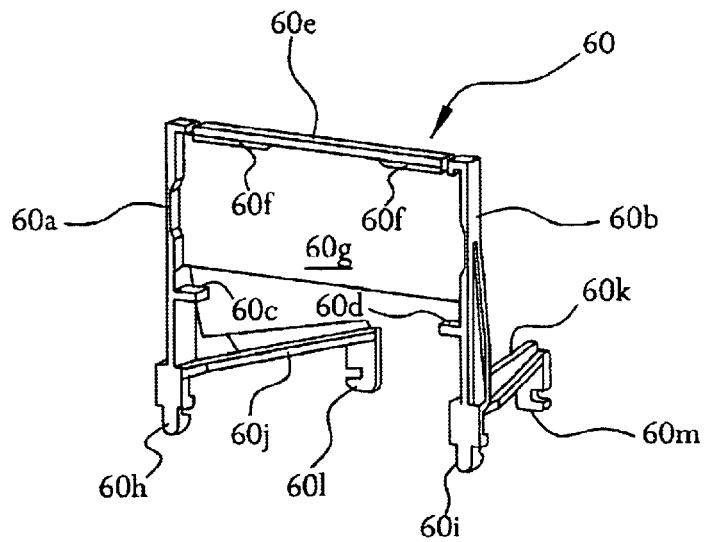
FIG. 10 is a side perspective view of the mounting bracket shown in FIG. 9.

The LCD 40 is mounted on the main circuit board 38 using a support bracket 60 (see FIGS. 9 and 10). The support bracket 60 secures the LCD 40 in a substantially perpendicular orientation in relation to the main circuit board 38. (The support bracket 60 thus permits the main circuit board 38 to be positioned in a substantially horizontal orientation; this feature can facilitate a more compact overall configuration for the electrical-energy meter 10 in comparison to conventional mounting arrangements in which the LCD is positioned substantially parallel to a corresponding circuit board.)

The support bracket 60 is preferably molded from a reinforced thermoplastic material such as polyketone or PBT. The support bracket 60 includes a first and a second support arm 60a, 60b, and a first and a second mounting foot 60c, 60d adjoining the respective first and second support arms 60a, 60b. The support bracket 60 also includes a transverse member 60e having molded springs 60f formed thereon. The LCD 40 is supported by the mounting feet 60c, 60d. More particularly, the springs 60f bias the LCD 40 downward, into the mounting feet 60c, 60d, thereby restraining the LCD 40 vertically. The LCD 40 is restrained horizontally by the support arms 60a, 60b, and by a backing plate 60g that adjoins the support arms 60a, 60b.

The support bracket 60 further comprises a first and a second forward mount 60h, 60i, and a third and a fourth mounting arm 60j, 60k. The third and fourth mounting arms 60j, 60k adjoin the respective first and second forward mounts 60h, 60i, and extend substantially perpendicularly to the first and second support arms 60a, 60b. The support bracket 60 also comprises a first and a second rearward mount 60l, 60m.

The forward mounts 60h, 60i each have a groove formed therein and adapted to securely receive an edge of the main circuit board 38, as depicted in FIG. 9. The rearward mounts 60l, 60m each have a notch formed therein, and are adapted to snap into a respective slot formed in the main circuit board 38. More particularly, the rearward mounts 60l, 60m are adapted to resiliently deform as the rearward mounts 60l, 60m are urged into the respective slots. The rearward mounts 60l, 60m are adapted to securely engage the main circuit board 38 by way of the notches once the rearward mounts 60l, 60m have been inserted into the slots.

Notably, the configuration of the support bracket 60 permits the LCD 40 to be mounted on the main circuit board 38 without the use of any external fasteners. More particularly, the LCD 40 is mounted by snapping the LCD 40 into the support bracket 60, inserting leads 40a of the LCD 40 into corresponding through holes formed in the main circuit board 38, and mounting the support bracket 60 on the main circuit board 38 by way of the mounts 60h, 60i, 60l, 60m. The leads 40a of the LCD 40 (and the other component leads mounted on the main circuit board 38) are subsequently wave-soldered to the main circuit board 38.

It should be noted that the LCD 40 is specially configured to accommodate the perpendicular mounting arrangement between the LCD 40 and the main circuit board 38. In particular, the leads 40a of the LCD 40 extend entirely from one side of the LCD 40. Conventional LCDs, by contrast, typically have leads extending from opposing sides thereof.

Figure 11A:
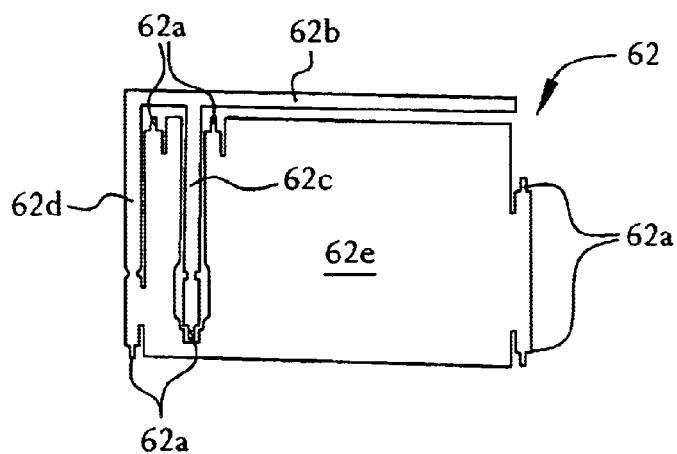
FIG. 11A is a top view of the radio-communications antenna shown in FIGS. 6 and 9, showing mounting tabs, a radio-frequency feed, and a ground feed of the antenna in their initial (flat) positions.
Figure 11B:
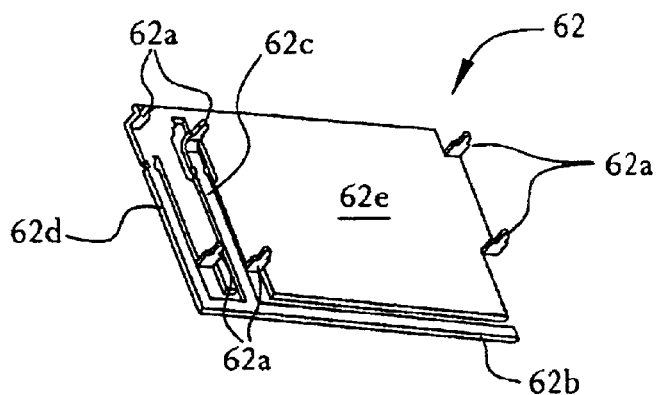
FIG. 11B is a top perspective view of the radio-communications antenna shown in FIGS. 6, 9, and 11A, showing the mounting tabs in their deployed positions and the radio-frequency and ground feeds in their initial (flat) positions.
Figure 12:
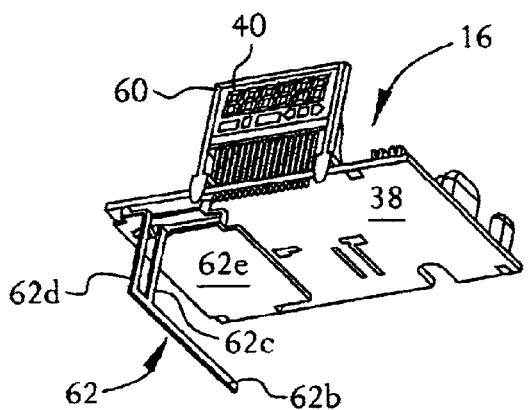
FIG. 12 is a bottom perspective view of the circuit board, the radio-communications antenna, the liquid crystal display, and the mounting bracket shown in FIGS. 6, 9, 10, 11A, or 11B, with the mounting tabs and the radio-frequency and ground feeds of the radio-communications antenna in their deployed positions.

The electrical-energy meter 10 further comprises an antenna 62 that facilitates radio communication between the electrical-energy meter 10 and a remote device, e.g., a transmitting and receiving device used by the utility company to remotely obtain readings from the electrical-energy meter 10 (see FIGS. 11A, 11B, 6, and 12). The antenna is mounted on a bottom (lower) surface of the main circuit board 38, as depicted in FIGS. 6 and 12). The antenna 62 comprises a plurality of mounting tabs 62a, an antenna element 62b, a radio-frequency (RF) feed 63c, a ground feed 62d, and a ground plane 62e.

The antenna 62 is depicted in FIG. 11A in its initial flat, or shipping, configuration. The antenna 62 is preferably formed from a single piece of sheet metal such as bronze. The sheet metal is stamped so that portions of the sheet-metal piece can be bent to form the various components of the antenna 62. In particular, the sheet-metal piece is stamped to initially define to mounting tabs 62a, the antenna element 62b, the RF feed 62c, and the ground feed 62d (see FIG. 11A).

The mounting tabs 62a are bendable from their initial (flat) position to a deployed position in which the mounting tabs 62a project substantially perpendicularly from the ground plane 62e (FIG. 11B). The antenna 62 is mounted on the main circuit board 38 by inserting ends of the mounting tabs 62a into respective through holes formed in the main circuit board 38, and then soldering or clenching the mounting tabs 38a to the main circuit board 38.

The RF feed 62c and the ground feed 62d are likewise bendable from their initial (flat) positions (FIG. 11A) to unfolded positions in which RF feed 62c and the ground feed 62d project substantially perpendicularly from the ground plane 62e (FIGS. 6 and 12). Notches are formed on the RF feed 62c and the ground feed 62d to facilitate precise bending of the RF feed 62c and the ground feed 62d, by hand, at predefined locations thereon (see FIG. 11A).

The noted design of the antenna 62 permits the antenna 62 to be shipped from its manufacturer in a flat, compact configuration that minimizes the possibility of damage thereto. Moreover, the one-piece configuration of the antenna 62 assists in minimizing the parts count of the electrical-energy meter 10 (conventional antennas of this type are typically formed in two or more pieces). Furthermore, design of the antenna 62 allows the antenna 62 to be manufactured from a minimal amount material, using a relatively simple bend die.

Details relating to the inner housing 18 are as follows. The inner housing 18 comprises a substantially flat rearward portion 18a and a unitarily formed, substantially cylindrical forward portion 18b (see FIGS. 13A and 13C). The inner housing 18 is preferably molded from a reinforced thermoplastic material such as polyketone or PBT.

The rearward portion 18a has a cutout, or window 66 formed therein. The window 66 is substantially aligned with the LCD 40. More particularly, a portion of the LCD 40 resides within the window 66 when the electrical-energy meter 10 is assembled, thereby facilitating visual readings of the LCD 40. A support rib 68 is formed around a portion of the window 66, and is adapted to engage an edge of the LCD 40 (see FIG. 13C). The support rib 68 thereby ensures that the LCD 40 remains substantially centered in the window 40. Moreover, a breakout portion 18c is formed in the rearward portion 18a. The breakout portion 18c can readily be removed from the rearward portion 18a to enlarge the window 66, thereby permitting the window 66 to accommodate LCDs larger than the LCD 40.

Figure 13A:
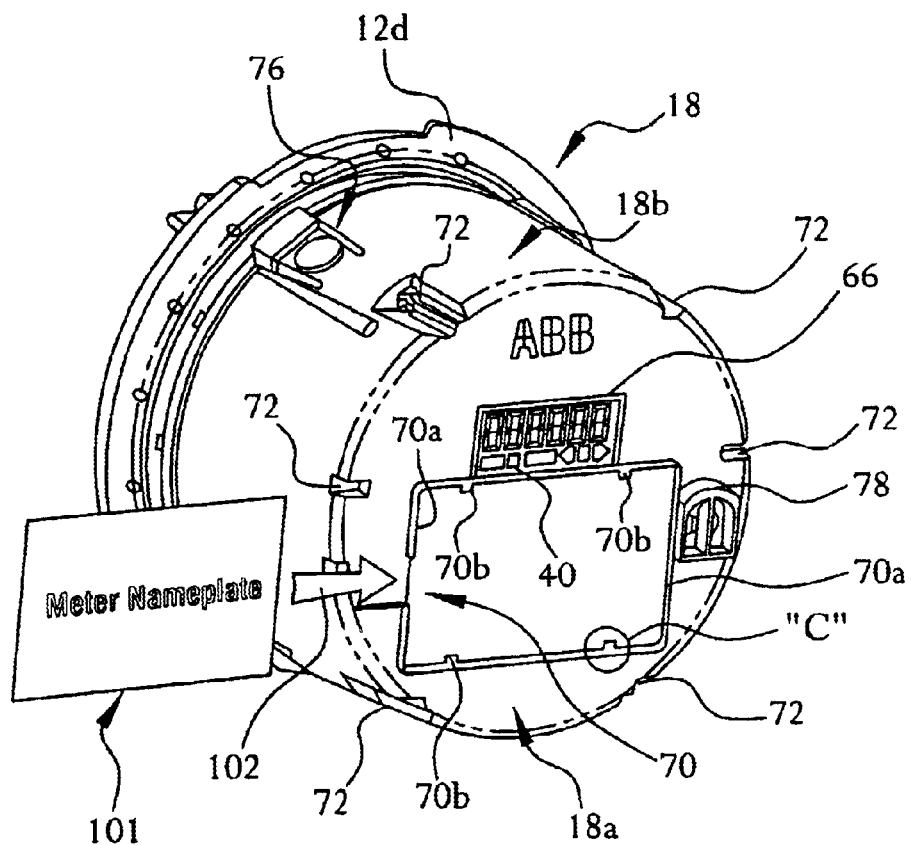
FIG. 13A is a top perspective view of the base shown in FIGS. 3 and 5, and an inner housing and nameplate of the electrical-energy meter shown in FIGS. 1 and 2.
Figure 13B:
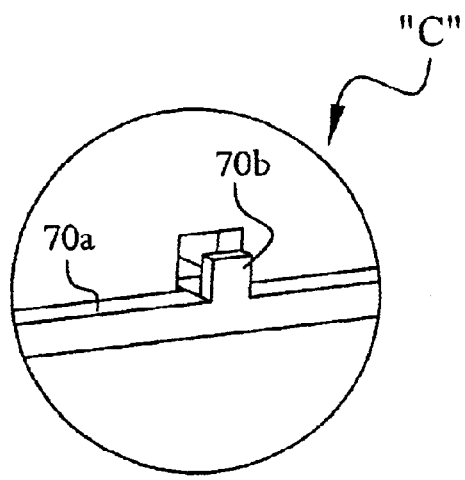
FIG. 13B is a magnified view of the area designated "C" in FIG. 13A.
Figure 13C:
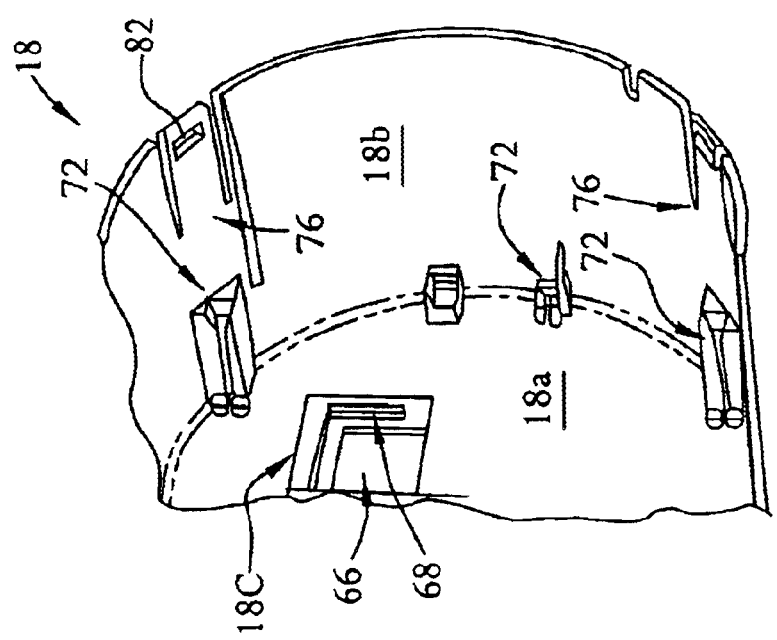
FIG. 13C is a top perspective, cutaway view of the inner housing shown in FIGS. 13A and 13B.

The rearward portion 18a of the inner housing 18 also includes a nameplate holder 70 (see FIG. 13A; the nameplate holder 70 is not depicted in FIG. 13C, for clarity). The nameplate holder 70 is located below the window 66 on the outer face of the rearward portion 18a. The nameplate holder 70 accommodates a standard credit-card-sized (CR-80) plastic nameplate 101.

The nameplate holder 70 is defined by a rib 70a and tabs 70b unitarily formed with the rib 70a. The nameplate 101 is inserted into the nameplate holder 70 by sliding the nameplate under the tabs 70b, in the direction shown by the arrow 102 in FIG. 13A. The rib 70a restrains the nameplate laterally and vertically, i.e., side-to-side and vertically. The tabs 70b urge the nameplate inward, i.e., toward the rearward portion 18a, and thereby restrain the nameplate from movement away from the rearward portion 18a.

The rib 70a has a break, or gap, formed therein to facilitate removal of the nameplate 101. The resilience of the thermoplastic material from which the tabs 70b are formed permits the nameplate 101 to be quickly and easily installed in and removed from the inner cover 18 by hand. Moreover, the use of the standard, CR-80 nameplate permits the nameplate 101 to purchased or manufactured at a relatively low cost.

A plurality of circuit-board support fingers 72 are formed within the inner housing 18 (see FIGS. 13A and 13C). The circuit-board support fingers 72 are unitarily formed with the forward and rearward portions 18a, 18b. The circuit-board support fingers 72 each have a groove formed therein for securely engaging an edge of the main circuit board 38, or an edge of one of the optional circuit boards 74a, or 74c. The circuit-board support fingers 72 thus support corresponding ends of the main circuit board 38 or the optional circuit boards 74a, 74c, and thereby supplement the support provided by the circuit-board support member 14. This arrangement results in a secure and stable mounting arrangement for the main circuit board 38 and the optional circuit boards 74a, 74c.

A port 78 for an optical-communications probe is formed in the rearward portion 18a and is coupled to the main circuit board 38 by way of optical fibers (not shown) (see FIG. 13A; the port 78 is not depicted in FIG. 13C, for clarity). This feature permits service personnel to test the electrical-energy meter 10 without removing the inner housing 18. Hence, the electrical-energy meter 10 can be tested without exposing service personnel to the high voltages within the electrical-energy meter 10.

Figure 8B:
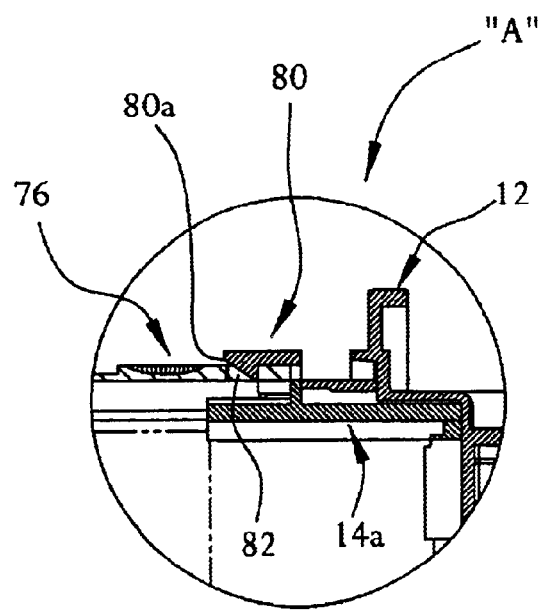
FIG. 8B is a magnified view of the area designated "A" in FIG. 8A.
Figure 8C:
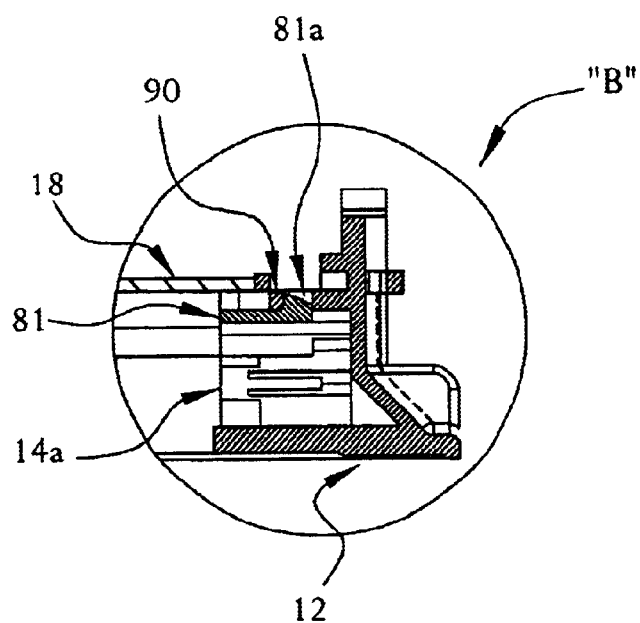
FIG. 8C is a magnified view of the area designated "B" in FIG. 8A.

The inner housing 18 is secured to the circuit-board support member 14 by four snaps 76 formed in the forward portion 18b (see FIGS. 8B, 13A, and 13C). The snaps 76 are each adapted to engage a corresponding retaining clip 80 formed on the circuit-board support member 14 (see FIGS. 7, 8A, and 8B). Each snap 76 has a through hole 82 formed therein.

The inner housing 18 and the circuit-board support member 14 are mated by substantially aligning each snap 76 with a corresponding retaining clip 80, and urging the inner housing 18 toward the circuit-board support member 14 by applying moderate force to the inner housing 18. A barb-shaped portion 80a of each retaining clip 80 is adapted to resiliently deform as the snap 76 subsequently becomes disposed within the retaining clip 80. Continued insertion of the snap 76 into the retaining clip 80 eventually causes each barb-shaped portion 80a to substantially align with a corresponding through hole 82. The resilience of the barb-shaped portion 80a causes the barb-shaped portion 80a to snap into the through hole 82 and thereby engage the snap 76.

The engagement of the barb-shaped portions 80a and the corresponding snaps 76 retains the inner housing 18 on the circuit-board support member 14 (and the base 12). The inner housing 18 can be released from the circuit-board support member 14 by depressing the snaps 76 to move the barb-shaped portions 80a out of the corresponding through holes 82.

Hence, the inner housing 18 can be quickly and easily secured to and removed from the circuit-board support member 14 (and the base 12) without the use of external fasteners or tooling. Moreover, the snaps 76 and the retaining clips 80 provide a secure connection that substantially minimizes the potential for accidental separation of the inner housing 18 from the circuit-board support member 14.

Figure 14B:
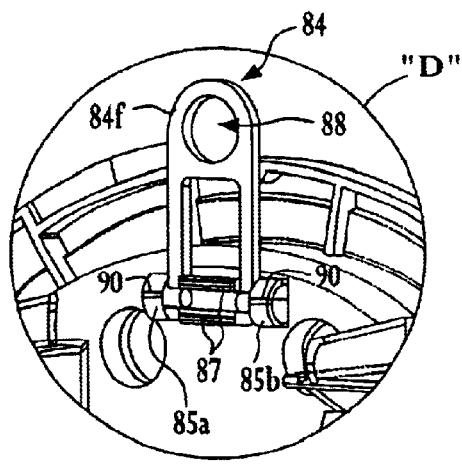
FIG. 14B is a magnified view of the area designated "D" in FIG. 14A, with the hanger in a deployed position.
Figure 14C:
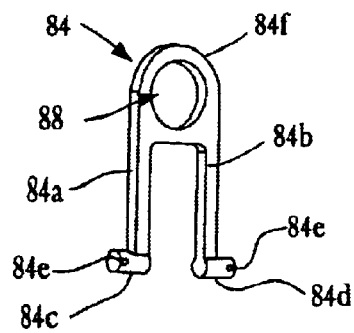
FIG. 14C is a side perspective view of the hanger shown in FIGS. 14A and 14B.

The electrical-energy meter 10 includes a hanger 84 for suspending the electrical-energy meter 10 during maintenance or repair operations at a service shop or other remote location, in accordance with ANSI requirements (see FIGS. 14A–14C). The hanger 84 is preferably molded from a reinforced thermoplastic material such as polyketone or PBT. The hanger 84 comprises a first and a second leg 84a, 84b, and a first and a second pin 84c, 84d unitarily formed with the respective first and second legs 84a, 84b.

The hanger 84 is pivotally coupled to the base 12. More particularly, the base 12 includes a first and a second receptacle 85a, 85b adapted to receive the respective first and second pins 84c, 84d. The pins 84c, 84d are inserted into the receptacles 85a, 85b by squeezing the first and second legs 84a, 84b toward each other. The resilient deformation of the legs 84a, 84b draws the pins 84c, 84d closer, and thereby permits the pins 84c, 84d to fit between the receptacles 85a, 85b. Releasing the pressure on the legs 84a, 84b causes the legs 84a, 84b to spread apart, thereby causing the pins 84c, 84d to become disposed with the respective receptacles 85a, 85b. The hanger 84 can thus be quickly and easily installed on and removed from the base 12 without the use of any external fasteners or tooling.

The hanger 84 is pivotable between a stored position (FIG. 14A) and a deployed position (FIG. 14B). Notches 84e are formed in opposing sides of the first and second pins 84a, 84b (see FIG. 14C). The notches 84e are adapted to engage corresponding ridges 90 formed on the base 12 (see FIG. 14B). More particularly, the notches 84e engage the ridges 90 when the hanger 84 is in the stored or the deployed positions. Engagement of the notches 84e and the ridges 90 secures the hanger in the stored or deployed positions.

Two ribs 87 are formed on the base 12, between the receptacles 85a, 85b (see FIG. 14B). The ribs 87 inhibit the legs 84a, 84b from moving toward each other when the hanger 84 is in the deployed position. This feature minimizes the potential for the hanger 84 to disengage from the base 12 when the hanger 84 is in the deployed position. (The ribs 87 also minimize the potential for the hanger 84 to disengage from the base 12 when the hanger 84 is in the stored position.)

An upper portion 84f of the hanger 84 has a through hole 88 formed therein. The electrical-energy meter 10 can be suspended during service operations or periods of storage by placing the hanger 84 over a hook or a similar device so that the hook or similar device engages the upper portion 84f by way of the through hole 88.

The hanger 84 is simple, inexpensive, compact, and durable in comparison to conventional suspension means. Conventional suspension means typically comprise a metallic bracket riveted to the base. The metallic bracket rotates about the rivet, in a plane that is substantially parallel to the adjacent surface of the meter base. This type of suspension means typically requires a relatively large amount of space on the meter base to accommodate rotation of the hanger. Moreover, the riveted hanger is relatively difficult to install on and remove from the meter, and the rivet and the adjacent surfaces of the hanger and base are subject to wear due to the relatively high friction between those components.

The cover 20 has a substantially transparent end portion 20a that provides visual access to the LCD 40 (see FIG. 1). The cover 20 includes a flange portion 20b. The cover 20 is secured to the base 12 by resilient tabs 20c formed in the flange portion 20b and adapted to securely engage a flange portion 12d on the base 12. A gasket 99 is positioned between the flange portions 20b, 12d to substantially seal the interface between the cover 20 and the base 12.

The electrical-energy meter 10 may incorporate an optional power-disconnect function that permits the utility company to switch the electrical power to the residential dwelling on and off, on a remote basis, by way of the electrical-energy meter 10. The power-disconnect function is provided by a total-service disconnect switch 92 and a control board 93 electrically coupled to the disconnect switch 92 (see FIGS. 5, 15A and 15B). The control board 93 is depicted in FIG. 15B as being located in the place of the optional circuit board 74a depicted in FIG. 7.

The disconnect switch 92 is electrically coupled to the contact blades 52a, 52b. The disconnect switch 92 is retained by the keys 94 of the circuit-board support member 14. The disconnect switch 92 is positioned over the contact blades 52a when the disconnect switch 92 is installed on the base 12, and thus facilitates retention of the contact blades 52a in the slots 54 of the base 12. Notably, the disconnect switch 92 is positioned so as to extend away from (rater than parallel to) the base 12, as best shown in FIG. 15B. This arrangement permits the disconnect switch 92 to be installed without reducing the amount of space available to accommodate the main circuit board 38. (Conventional meters typically mount the disconnect switch parallel to the base, or as a separate unit located outside of the meter.)

The control board 93 includes circuitry that facilitates radio communication with the utility company (by way of the antenna 62), thereby permitting the utility company to remotely activate and deactivate the power disconnect switch 92.

The above-described features of the electrical-energy meter 10 minimize the number of external fasteners needed to assemble the electrical-energy meter 10, and thereby lower the overall parts count and the manufacturing cost of the electrical-energy meter 10 in relation to a conventional solid-state electrical-energy meter of similar capabilities. Moreover, the electrical-energy meter 10 has a relatively compact design that facilitates the incorporation of design features that may not be possible in a conventional electrical-energy meter due to space constraints. Also, the extensive use of relatively strong and resilient thermoplastic materials contributes further to the compactness of the electrical-energy meter 10, and enhances the durability thereof. Furthermore, the electrical-energy meter 10 complies with applicable ANSI requirements.

It is to be understood that even though numerous characteristics and advantages of the present invention have been set forth in the foregoing description, the disclosure is illustrative only and changes may be made in detail within the principles of the invention to the full extent indicated by the broad general meaning of the terms in which the appended claims are expressed. For example, the electrical-energy meter 10 is readily configurable in ANSI-1S, -2S, -3S, -4S, and -12S standards.

What is claimed is:

1. An electrical-energy meter, comprising:
    a base adapted to be mounted on a supporting surface;
    a current sensor assembly comprising a plurality of contact blades extending through the base and adapted to electrically contact a conductor of electrical energy, and a current transformer mechanically coupled to the base and electrically coupled to the contact blades, the current transformer being adapted to produce an electrical output proportional to an electrical current in the conductor of electrical energy;
    a circuit board assembly comprising a main circuit board electrically coupled to the current transformer and the contact blades, the circuit board assembly being adapted to calculate and display a cumulative amount of electrical energy passing through the conductor of electrical energy based on the electrical output of the current transformer and a voltage of the conductor of electrical energy; and
    a circuit-board support member comprising a rim portion fixedly coupled to the base, and a first bracket adjoining the rim portion, the first bracket having a first and a second leg each extending away from the rim portion and the base and each being adapted to securely engage the main circuit board.

2. The electrical-energy meter of claim 1, where an end portion of the first voltage spring is electrically and mechanically coupled to a first major surface of the main circuit board, and an end portion of the second voltage spring is electrically and mechanically coupled to a second major surface of the main circuit board.

3. The electrical-energy meter of claim 2, where the first major surface of the main circuit board is a top surface of the main circuit board and the second major surface of the main circuit board is a bottom surface of the main circuit board.

4. The electrical-energy meter of claim 2, wherein an end portion of the first voltage spring is bent so that the end portion of the first voltage spring resiliently engages opposite sides of a first of the contact blades, and an end portion of the second voltage spring is bent so that the end portion of the second voltage spring resiliently engages opposite sides of a second of the contact blades.

5. The electrical-energy meter of claim 1, wherein the rim portion is substantially circular and has a circumferentially-extending forward edge, the first and second legs have a respective first and second groove formed therein and extending in a direction substantially perpendicular to the forward edge, and the first and second legs are adapted to securely engage opposing edges of the main circuit board by way of the respective first and second grooves whereby the main circuit board is substantially perpendicular to the forward edge of the rim portion.

6. The electrical-energy meter of claim 5, wherein the circuit board assembly further comprises a second circuit board and the circuit-board support member further comprises a first and a second circuit-board support finger adjoining the rim portion and each having a groove formed therein, the first and second circuit-board support fingers being adapted to securely engage opposing edges of the second circuit board by way of the grooves formed in the first and second circuit-board support fingers.

7. The electrical-energy meter of claim 6, wherein the circuit board assembly further comprises a third circuit board and the circuit-board support member further comprises a third and a fourth circuit-board support finger each having a groove formed therein, the third and fourth circuit-board support fingers being adapted to securely engage opposing edges of the third circuit board by way of the grooves formed in the third and fourth circuit-board support fingers.

8. The electrical-energy meter of claim 1, further comprising a second circuit board, wherein:
    the first bracket further comprises a transverse member adjoining the first and second legs of the first bracket and having a first groove formed therein;
    the transverse member of the first bracket securely engages a first edge of the second circuit board by way of the first groove;
    the circuit-board support member further comprises a second bracket having (i) a first and a second leg each adjoining the rim portion and (ii) a transverse portion adjoining the first and second legs of the second bracket and having a second groove formed therein;

the transverse member of the second bracket securely engages a second edge of the second circuit board by way of the second groove; and the first and second grooves are spaced apart from the first circuit board by unequal distances, whereby the second circuit board is angled in relation to the first circuit board.

9. The electrical-energy meter of claim 1, wherein:

the rim portion of the circuit-board support member comprises a plurality of retaining clips each having a barb-shaped portion;

the base comprises a circumferentially-extending rim portion having a plurality of through holes formed therein;

each of the retaining clips is adapted to resiliently deflect as the circuit-board support member is mated with the base; and the barb-shaped portion of each the retaining clips is adapted to substantially align with and become disposed in a respective one of the through holes as the circuit-board support member is mated with the base thereby causing the retaining clips to securely engage the rim portion of the base whereby the circuit-board support member is secured to the base without the use of external fasteners.

10. The electrical-energy meter of claim 1, wherein the circuit board assembly further comprises a substantially flat liquid crystal display mounted on and electrically coupled to the main circuit board and adapted to display the cumulative amount of energy passing through the conductor of electrical energy.

11. The electrical-energy meter of claim 10, wherein the circuit board assembly further comprises a support bracket mounted on the main circuit board and the liquid crystal display is mounted in the support bracket in an orientation substantially perpendicular to the main circuit board.

12. The electrical-energy meter of claim 11, wherein the support bracket is formed from a thermoplastic material and comprises:

a first and a second support arm;

a first and a second support foot adjoining the respective first and second support arms;

a transverse member adjoining the first and second support arms;

a molded spring formed on the transverse member;

a first and a second mounting arm adjoining the respective first and second support arms and extending substantially perpendicular to the first and second support arms;

a first and a second forward mount adjoining the respective first and second mounting arms, the first and second forward mounts each having a groove formed therein and each being adapted to securely engage an edge of the main circuit board by way of the respective grooves; and a first and a second rearward mount adjoining the respective first and second mounting arms, the first and second rearward mounts each having a notch formed therein and being adapted to be inserted through respective slots formed in the main circuit board so that the first and second rearward mounts securely engage the main circuit board by way of the notches, and the first and second support arms, the first and second support feet, the transverse member, and the spring are adapted to securely engage the liquid crystal display and thereby secure the liquid crystal display in position in relation to the main circuit board.

13. The electrical-energy meter of claim 11, wherein the liquid crystal display is electrically coupled to the main circuit board by a plurality of electrically-conductive leads extending from only one side of the liquid crystal display.

14. The electrical-energy meter of claim 1, further comprising an inner housing fixedly coupled to the circuit-board support member so that the inner housing and the base substantially enclose the circuit board assembly and the current sensor assembly, wherein the inner housing has a cutout formed therein and substantially aligned with the liquid crystal display.

15. The electrical-energy meter of claim 14, wherein the inner housing has a first and a second circuit-board support finger formed thereon, the first and second circuit-board support fingers each having a groove formed therein and each being adapted to securely receive one of the edges of the main circuit board in the respective grooves whereby the main circuit board is supported and restrained by the inner housing.

16. The electrical-energy meter of claim 14, wherein the inner housing has an optical port formed therein and optically coupled to the main circuit board whereby diagnostic checks can be run on the electrical energy meter without exposing service personnel to electrical voltages within the electrical-energy meter.

17. The electrical-energy meter of claim 14, wherein the inner housing is formed form a thermoplastic material.

18. The electrical-energy meter of claim 14, wherein a portion of the inner housing adjacent the cutout is adapted to be removed to thereby increase the size of the cutout.

19. The electrical-energy meter of claim 14, wherein the base and the circuit-board support member are each formed from a thermoplastic material.

20. The electrical-energy meter of claim 14, wherein the inner housing comprises a nameplate holder comprising (i) a rib formed on a surface of the inner housing and adapted to securely engage edges of the nameplate to thereby inhibit movement of the nameplate in a direction substantially parallel to the surface of the inner housing, and (ii) a tab spaced apart from the surface of the inner housing so that a portion of the nameplate is securely positioned between the tab and the surface of the inner housing whereby the tab inhibits movement of the nameplate away from the surface of the inner housing.

21. The electrical-energy meter of claim 20, further comprising the nameplate, wherein the nameplate comprises a standard credit-card-sized plastic card.

22. The electrical-energy meter of claim 14, wherein:

the rim portion the circuit-board support member comprises a plurality of retaining clips each having a barb-shaped portion;

the inner housing comprises a plurality of snaps each having a through hole formed therein;

each of the retaining clips is adapted to resiliently deflect as the inner housing is mated with the circuit-board support member; and the barb-shaped portion of each the retaining clips is adapted to substantially align with and become disposed in a respective one of the through holes as the inner housing is mated with the circuit-board support member thereby causing the retaining clips securely engage the inner housing whereby the inner housing is secured to the circuit-board support member without the use of external fasteners.

23. The electrical-energy meter of claim 1, further comprising a hanger pivotally coupled the base, wherein the hanger comprises a first and a second mounting pin and the base comprises a first and a second receptacle adapted to receive the respective first and second mounting pins.

24. The electrical-energy meter of claim 23, wherein the hanger is formed from a thermoplastic material.

25. The electrical-energy meter of claim 23, wherein the hanger comprises a first and a second leg adjoining the respective first and second pins, and an upper portion adjoining the first and second legs, the upper portion having a through hole formed whereby the electrical-energy meter can be suspended from a supporting fixture by way of the hanger.

26. The electrical-energy meter of claim 23, wherein (i) the hanger is pivotable between a stored position and a deployed position, (ii) the first and second pins each have a first and a second notch formed therein, (iii) the base has a first and a second rib formed thereon, (iv) the first and second ribs are adapted to engage the first notches of the first and second pins when the hanger is in the stored position thereby inhibiting movement of the hanger from the stored position, and (v) the first and second ribs are adapted to engage the second notches of the first and second pins when the hanger is in the deployed position thereby inhibiting movement of the hanger from the deployed position.

27. The electrical-energy meter of claim 1, further comprising a power-disconnect switch electrically coupled to the contact blades and fixedly coupled to the base so that the power-disconnect switch extends away from the base.

28. The electrical-energy meter of claim 27, wherein the power disconnect switch is adapted to interrupt a flow of the electrical energy through the conductor of electrical energy in response to radio communications from a source external to the electrical-energy meter.

29. The electrical-energy meter of claim 1, wherein the current transformer comprises a mounting tab and the base comprises a tongue-shaped support adapted to securely engage an inner circumference of the current transformer thereby securing the current transformed to the base.

30. The electrical-energy meter of claim 29, wherein (i) the electrical-energy meter comprises a first and a second of the current transformers, (ii) the first and second current transformers each comprise a mounting tab, and (iii) the base comprises a first receptacle adapted to securely receive the mounting tab of the first current transformer and a second receptacle adapted to securely receive the mounting tab of the second current transformer.

31. The electrical-energy meter of claim 30, wherein the first and second current transformers each comprise a second of the mounting tabs, the circuit-board support member further comprises a second bracket having a first and a second leg each adjoining the rim portion and a transverse member adjoining the first and second legs of the second bracket, the transverse member has a groove formed therein, and the second bracket securely engages the first and second current transformer by way of the groove.

32. The electrical-energy meter of claim 1, further comprising a radio-communications antenna electrically and mechanically coupled to the main circuit board, the radio-communications antenna comprising an antenna element, a radio frequency feed adjoining the antenna element, a ground feed adjoining the antenna element, a ground plane adjoining the radio frequency feed and the ground feed, and a mounting tab adjoining the ground plane and adapted to be mechanically and electrically coupled to the main circuit board.

33. The electrical-energy meter of claim 32, wherein;

the radio frequency feed is bendable between a first position wherein the radio frequency feed and the ground plane are substantially co-planar, and a second position wherein the radio frequency feed and the ground plane are substantially perpendicular;

the ground frequency feed is bendable between a first position wherein the ground feed and the ground plane are substantially co-planar, and a second position wherein the ground feed and the ground plane are substantially perpendicular; and the mating tab is bendable between a first position wherein the mating tab and the ground plane are substantially co-planar, and a second position wherein the mating tab and the ground plane are substantially perpendicular.

34. The electrical-energy meter of claim 33, wherein the radio-communications antenna is notched at a bending point of the radio-frequency feed, the ground feed, and the mount tab.

35. The electrical-energy meter of claim 1, wherein the circuit-board support member includes a key adjoining the rim portion and adapted to securely receive one of the contact blades.

* * * * *

UNITED STATES PATENT AND TRADEMARK OFFICE
CERTIFICATE OF CORRECTION

PATENT NO. : 6,838,867 B2
DATED : January 4, 2005
INVENTOR(S) : Garry M. Loy

It is certified that error appears in the above-identified patent and that said Letters Patent is hereby corrected as shown below:

Column 5,
Line 35, delete "30"

Column 16,
Line 28, "form a thermoplastic material" should read -- from a thermoplastic material --

Signed and Sealed this

Fifth Day of April, 2005

JON W. DUDAS
*Director of the United States Patent and Trademark Office*